US012003091B2

(12) United States Patent
Beckert et al.

(10) Patent No.: US 12,003,091 B2
(45) Date of Patent: Jun. 4, 2024

(54) CIRCUIT BREAKER DEVICE FOR DC VOLTAGE

(71) Applicant: Siemens Aktiengesellschaft, Munich (DE)

(72) Inventors: Thomas Beckert, Nuremberg (DE); Peter Koellensperger, Heroldsberg (DE); Hauke Nannen, Nuremberg (DE); Hubert Schierling, Erlangen (DE); Dieter Waegele, Oberasbach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 265 days.

(21) Appl. No.: 17/440,937

(22) PCT Filed: Mar. 13, 2020

(86) PCT No.: PCT/EP2020/056747
§ 371 (c)(1),
(2) Date: Sep. 20, 2021

(87) PCT Pub. No.: WO2020/193167
PCT Pub. Date: Oct. 1, 2020

(65) Prior Publication Data
US 2022/0166206 A1    May 26, 2022

(30) Foreign Application Priority Data

Mar. 22, 2019    (DE) .................. 10 2019 203 977.4

(51) Int. Cl.
*H02H 3/087*    (2006.01)
*H02H 1/00*    (2006.01)
(Continued)

(52) U.S. Cl.
CPC .......... *H02H 3/087* (2013.01); *H02H 1/0007* (2013.01); *H02H 3/44* (2013.01);
(Continued)

(58) Field of Classification Search
CPC ............ H02H 3/02; H02H 3/08; H02H 3/081; H02H 3/087; H02H 3/44; H02H 7/10;
(Continued)

(56) References Cited

U.S. PATENT DOCUMENTS 5,153,802 A    10/1992  Gerin
9,659,721 B1 *  5/2017  Sastry ............... H02H 3/44
(Continued)

FOREIGN PATENT DOCUMENTS

EP          3379725 A1     9/2018
WO    WO 2009104971 A1    8/2009
(Continued)

OTHER PUBLICATIONS

PCT International Search Report and Written Opinion of International Searching Authority dated Jul. 2, 2020 corresponding to PCT International Application No. PCT/EP2020/056747 filed Mar. 13, 2020.
(Continued)

*Primary Examiner* — Thienvu V Tran
*Assistant Examiner* — Shahzeb K Ahmad
(74) *Attorney, Agent, or Firm* — Harness, Dickey & Pierce, P.L.C.

(57) ABSTRACT

A circuit breaker device is for coupling a DC voltage branch to a positive and a negative conductor on a DC voltage bus. In an embodiment, the circuit breaker device includes a series circuit including a safety fuse and a unidirectional switch module. The switch module has a parallel circuit includes a controllable semiconductor switch element that is
(Continued)

conductive in a first current direction and a diode that is conductive in the opposite current direction.

21 Claims, 3 Drawing Sheets

(51) Int. Cl.
*H02H 3/44* (2006.01)
*H02H 7/26* (2006.01)
*H02J 1/00* (2006.01)
*H02M 1/32* (2007.01)
*H03K 17/082* (2006.01)

(52) U.S. Cl.
CPC ............... *H02H 7/268* (2013.01); *H02J 1/00* (2013.01); *H02M 1/32* (2013.01); *H03K 17/0828* (2013.01); *H03K 2217/0027* (2013.01)

(58) Field of Classification Search
CPC .......... H02H 7/1213; H02H 7/22; H02H 7/26; H02H 7/267; H02H 7/268; H02H 1/0007; H02M 1/32; H03K 17/08; H03K 17/0828; H03K 2217/0027
See application file for complete search history.

(56) References Cited

U.S. PATENT DOCUMENTS

| | | | |
|---|---|---|---|
| 2004/0027734 A1* | 2/2004 | Fairfax | H01H 9/542 361/2 |
| 2004/0027749 A1 | 2/2004 | Zuercher et al. | |
| 2015/0229121 A1* | 8/2015 | Davidson | H02H 9/043 361/54 |
| 2016/0072269 A1* | 3/2016 | Esschendal | H02H 7/268 361/62 |
| 2017/0023618 A1 | 1/2017 | Douglass et al. | |
| 2017/0104327 A1* | 4/2017 | Nojima | H03K 17/72 |
| 2019/0206638 A1* | 7/2019 | Askan | H01H 9/548 |
| 2020/0136604 A1 | 4/2020 | Schierling et al. | |

FOREIGN PATENT DOCUMENTS

WO    WO 2014139559 A1    9/2014
WO    WO 2015175346 A1    11/2015

OTHER PUBLICATIONS

German Office Action for German Application No. 10 2019 203 977.4 dated Mar. 9, 2020.

* cited by examiner

CIRCUIT BREAKER DEVICE FOR DC VOLTAGE

PRIORITY STATEMENT

This application is the national phase under 35 U.S.C. § 371 of PCT International Application No. PCT/EP2020/056747 which has an International filing date of Mar. 13, 2020, which claims priority to German patent application DE 10 2019 203 977.4 filed Mar. 22, 2019, the entire contents of each of which are hereby incorporated herein by reference.

FIELD

Embodiments of the present application generally relate to a circuit breaker device for coupling a DC voltage branch with a positive conductor and a negative conductor to a DC voltage bus for a device.

BACKGROUND

DC voltage is used to mean voltages of up to 1500 volts. DC voltages up to this level are also referred to as low voltage. More specifically, DC voltage is used to mean, in particular, voltages which are greater than the extra-low voltage having a level of 120 volts DC. DC voltage is used to mean voltages of 400-800 volts, in particular.

A DC voltage circuit or DC circuit is used to mean circuits for currents, in particular nominal currents or maximum currents, of 2 to 1000 amps; more specifically for currents of 2 amps to 400 amps or 200 amps.

A DC voltage bus is used to mean an at least two-conductor system having a positive conductor and a negative conductor, which system is supplied with DC voltage by at least one energy source. A (DC voltage) device, for example a DC voltage load, a load, an inverter, a combined energy sink or energy source, a pure (further) energy source, etc., is connected to the DC voltage bus via a DC voltage branch in each case. A plurality of DC voltage devices may also be connected to a DC voltage branch.

A DC voltage device is used to mean, in particular, a device having a power of 1 kilowatt to 500 kilowatts.

In the meantime, DC voltage circuits, also referred to as DC voltage networks or low-voltage DC networks, have been increasingly developed and constructed and usually have a DC voltage bus with DC voltage branches.

The DC voltage branches, also referred to as load feeders, are usually protected using a DC voltage switch (DC switch), referred to as a switching device in the present case. This switching device has two switching modules having a controllable semiconductor switching element, also referred to as a power electronic switching element, which may have a diode connected in parallel with it.

A switching device for coupling a DC voltage branch to a DC voltage bus according to the prior art is shown in FIG. 1.

FIG. 1 shows a DC voltage bus DCB having a positive conductor DCP and a negative conductor DCN which are connected to a DC voltage energy source (not illustrated), for example having a DC voltage of 600 volts.

A first DC voltage branch DCA1, a second DC voltage branch DCA2 and a third DC voltage branch DCA3 are provided on the DC voltage bus DCB; further DC voltage branches may be provided.

The first DC voltage branch DCA1 is connected to a first device G1 via a first switching device SCH1, and the second DC voltage branch DCA2 is likewise connected to a second device G2 via a second switching device SCH2.

The first switching device SCH1 has a series circuit comprising a first switching module SM1 and a second switching module SM2. The first switching module SM1 has a first controllable semiconductor switching element Q1 for a first current direction, and the second switching module SM2 has a second controllable semiconductor switching element Q2 for the opposite current direction.

A first diode D1 which is in the conducting state in the opposite current direction to the first semiconductor switching element Q1 is connected in parallel with the first semiconductor switching element Q1, and a second diode D2 which is in the conducting state in the first current direction of the first semiconductor switching element Q1 is connected in parallel with the second semiconductor switching element Q2.

The first switching device SCH1 is designed with two-pole connections (for the positive and negative conductors); in the example, the first and second switching modules SM1, SM2 are in one conductor, in the positive conductor of the first DC voltage branch DCA1 in the example; the negative conductor is implemented and does not have any switching modules. Alternatively, the switching modules SM1, SM2 may also be arranged in the negative conductor or both conductors may have switching modules.

The series circuit comprising the two switching modules SM1, SM2 is followed, on the device side or DC voltage branch side, by an isolating contact, wherein a first isolating contact TK1 is provided for the positive conductor and a second isolating contact TK2 is provided for the negative conductor, generally referred to as an isolating contact or isolating contacts, for the DC-isolation of the device or a load.

The second switching device SCH2 is constructed in a similar manner. Further switching devices may be constructed in a similar manner.

The device G1, G2 is usually a DC voltage device having an electrical capacitance. In the example, the first device G1 has the first capacitance C1, and the second device G2 has the second capacitance C2. Significant amounts of energy are often stored in the capacitances of the (DC voltage) devices.

If a fault occurs in the DC voltage circuit/DC voltage network or DC network according to FIG. 1, for example a short circuit at the fault location F1 which is situated between the second switching device SCH2 and the second device G2, the short circuit there is fed from the surrounding DC voltage branches or DC branches and the energy sources or capacitances (of the devices) situated therein. This results in a high current in the associated switching device, the second switching device SCH2 in the example, which trips with a disconnection.

In this case, the important factor is that the other switching devices or switches do not trip, with the result that so-called selective disconnection of the fault takes place.

Furthermore, the other switching devices are intended to hinder the current flow from the respective DC voltage branch or load feeder to the short circuit as little as possible so that the switching device, the second switching device SCH2 in the example, trips safely. A semiconductor which can be switched off, for example an insulated gate bipolar transistor, IGBT for short, is therefore rather obstructive in the switching devices since they usually have a desaturation behavior and have a current-limiting effect. Furthermore, these semiconductor switches would switch off very quickly, generally in the single-digit μs range.

If a short circuit occurs at the fault location F1, the energy in the second capacitance C2 (or in the second capacitor C2) of the affected second device G2 will discharge into the fault location. In addition, the energy in the first capacitance C1 and in a possible third capacitance C3 (not illustrated) of the first and third DC voltage branches DCA1, DCA3 which are not affected will also discharge into the fault location F1.

The first and third capacitances C1, C3 may provide a high (fault) current. If the first device G1 has a low nominal current, for example, the first switching device SCH1 accordingly has small dimensions and can interrupt the current flow even if the fault has occurred in another branch or without continuing to feed the other branch until it is disconnected.

The aim is for the current in the reverse direction of the switching device to be able to be carried as long as possible (without saturation).

SUMMARY

The aforementioned problem has hitherto been solved by greatly overdimensioning the switching devices, which is expensive and uneconomical.

At least one embodiment of the present invention enables selectivity of the tripping of switching devices in DC voltage branches.

At least one embodiment is directed to a circuit breaker device.

According to at least one embodiment of the invention, a (safety) fuse is combined with a semiconductor switch, which is in the blocking state in one direction (disconnectable semiconductor switching element with a diode), to form a circuit breaker device for DC voltage.

At least one embodiment of the invention is directed to a circuit breaker device for coupling a DC voltage branch with a positive conductor and a negative conductor to a DC voltage bus, comprising:

a series circuit including a safety fuse and a unidirectional switching module (or is composed of such a series circuit for the current to be conducted in the DC voltage branch), wherein the switching module has (or is composed of) a parallel circuit comprising a controllable semiconductor switching element, which is conductive only in a first current direction, and a diode, which is in the conducting state in the opposite current direction.

BRIEF DESCRIPTION OF THE DRAWINGS

The described properties, features and advantages of this invention and the manner in which they are achieved become clearer and more distinctly comprehensible in connection with the following description of the example embodiments which are explained in more detail in connection with the drawing.

In the associated drawing.

DETAILED DESCRIPTION OF THE EXAMPLE EMBODIMENTS

Figure 1:
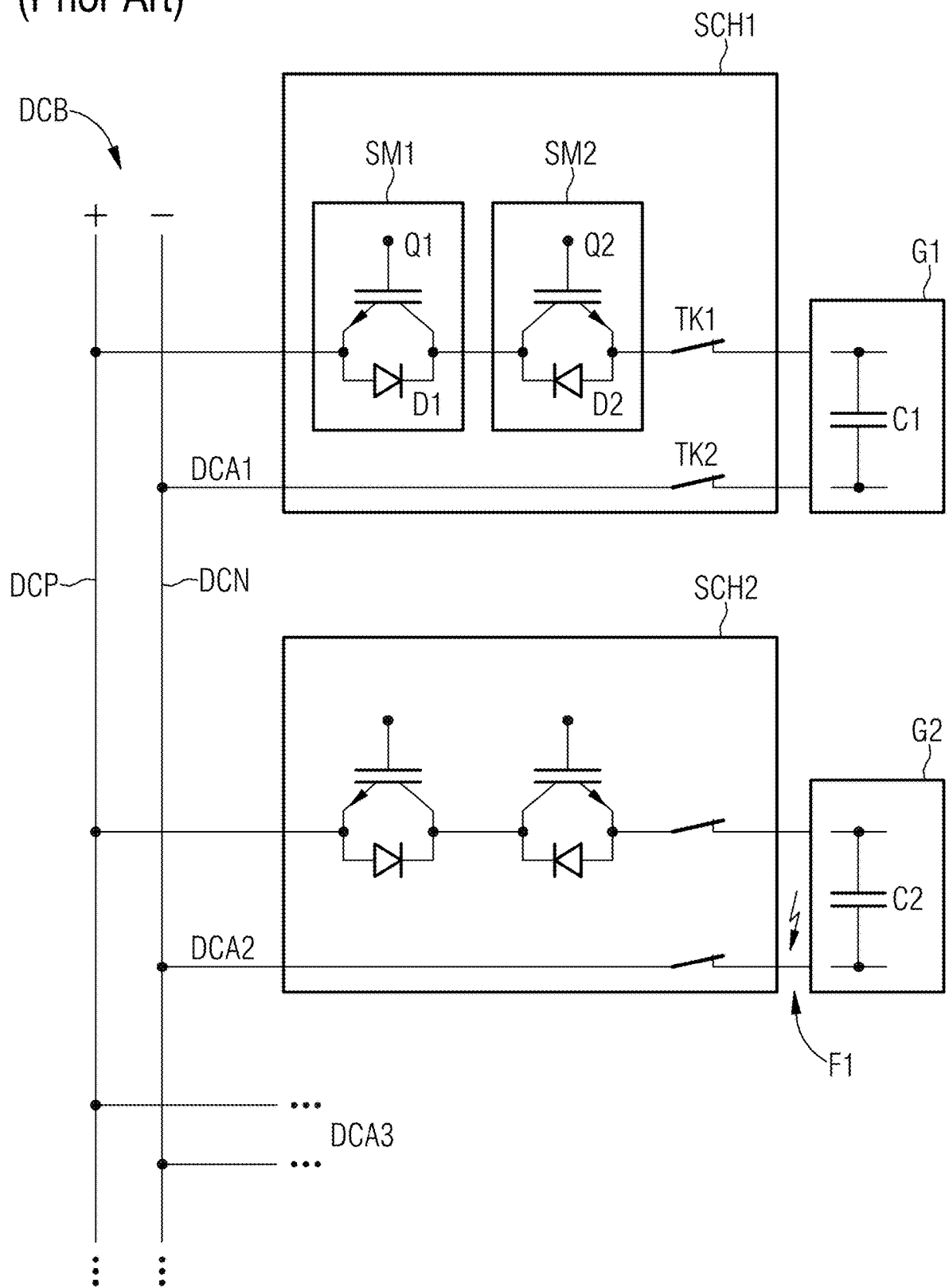
FIG. 1 shows a basic illustration of a DC voltage branch having a switching device on a DC voltage bus according to the prior art.

At least one embodiment of the invention is directed to a circuit breaker device for coupling a DC voltage branch with a positive conductor and a negative conductor to a DC voltage bus, comprising:

a series circuit including a safety fuse and a unidirectional switching module (or is composed of such a series circuit for the current to be conducted in the DC voltage branch), wherein the switching module has (or is composed of) a parallel circuit comprising a controllable semiconductor switching element, which is conductive only in a first current direction, and a diode, which is in the conducting state in the opposite current direction.

Advantageous configurations of the invention are specified in the claims.

In one advantageous configuration of at least one embodiment of the invention, the semiconductor switching element is an insulated gate bipolar transistor, a metal oxide semiconductor field effect transistor or a gallium nitride transistor.

This has the particular advantage that a simple solution is provided for the semiconductor switching elements of the switching module.

In one advantageous configuration of at least one embodiment of the invention, a current sensor which can determine the level of the current and the current direction is provided.

This has the particular advantage that an integrated and compact solution is provided for a switching device and manages without external sensors. The current sensor may be, for example, a sensor based on the Hall effect. This has the particular advantage that a simple solution for determining the level and the direction of the current is provided.

In one advantageous configuration of at least one embodiment of the invention, if the switching module is arranged in the positive conductor of the DC voltage branch, the semiconductor switching element is conductive counter to the direction of the DC voltage bus, that is to say in the direction of the DC voltage branch or of a device connected thereto, or, if the switching module is arranged in the negative conductor of the DC voltage branch, the semiconductor switching element is conductive in the direction of the DC voltage bus.

This has the particular advantage that a simple solution is provided for the positive or negative conductor.

In one advantageous configuration of at least one embodiment of the invention, the safety fuse is arranged on the side of the DC voltage bus.

This has the particular advantage that the DC voltage branch, including the switching module, is isolated, with the result that the switching module is free from voltage in the event of tripping.

In one advantageous configuration of at least one embodiment of the invention, a control device is provided and is connected to the switching module, in particular the semiconductor switching element, and to the current sensor. The control device is configured in such a manner that, if a first threshold value of the current is exceeded in the direction of the conductivity of the semiconductor switching element, the current flow is interrupted by the switching module.

The control device, in at least one embodiment, may also be configured in such a manner that, in the case of a rate of rise or rise of the current in the direction of the conductivity of the semiconductor switching element that exceeds a current rise threshold value, the current flow is interrupted by the switching module.

This has the particular advantage that, if the current flowing into the DC voltage branch toward the device rises sharply (switching module in the positive conductor), a (rapid) disconnection takes place. However, if the circuit breaker device sees a high current in the direction of the DC voltage bus that flows via the diode, only the (safety) fuse is tripped. The safety fuse trips only when the current is present for long enough.

In one advantageous configuration of at least one embodiment of the invention, the series circuit comprising the safety fuse and the unidirectional switching module is arranged in a housing, in particular the control device is included in the housing.

This has the particular advantage that a circuit breaker device in a housing is available.

In one advantageous configuration of at least one embodiment of the invention, the housing has a positive conductor input connection, a negative conductor input connection, a positive conductor output connection and a negative conductor output connection. The input connections can be connected to the DC voltage bus; the output connections can be connected to the DC voltage branch. The switching module can connect the positive conductor input connection to the positive conductor output connection or can connect the negative conductor input connection to the negative conductor output connection.

This has the particular advantage that a circuit breaker device having a two-pole connection and a housing is available.

In one advantageous configuration of at least one embodiment of the invention, the connections which are not connected to the switching module are connected to one another via an electrical line.

This has the particular advantage that there is a simple solution for the circuit breaker device with a housing, wherein cost-effective single-pole isolation is carried out.

In one advantageous configuration of at least one embodiment of the invention, the safety fuse is in the form of a pyroelectrically tripping fuse.

This has the particular advantage that deliberate tripping on the basis of a further criterion is possible.

In this case, the pyroelectrically tripping fuse or pyrofuse, in particular, may be controlled or triggered by a or the control device, in particular the control device SE1. The control device initiates a trigger signal if the signal provided by a current sensor satisfies a predetermined condition. The condition could be, for example, the exceeding of an I2t value when current flows in the direction of the DC voltage bus.

In one advantageous configuration of at least one embodiment of the invention, the diode has a low forward voltage; in particular, the diode is a mains diode or a Schottky diode.

This has the particular advantage that there is a particularly low voltage drop in the reverse direction, as a result of which there is a low power loss, on the one hand, and there is a maximum current in the reverse direction for increasing the selectivity, on the other hand.

All configurations, both in the dependent form referring back to an independent patent claim and referring back only to individual features or combinations of features of patent claims, improve a switching device for the purpose of improving the selectivity in a DC voltage network. As a result, devices of different power classes, in particular, can be operated from a common DC voltage bus.

FIG. 1 shows a basic illustration of a DC voltage branch having a switching device SCH1 on a DC voltage bus according to the prior art, as already described at the outset.

Figure 2:
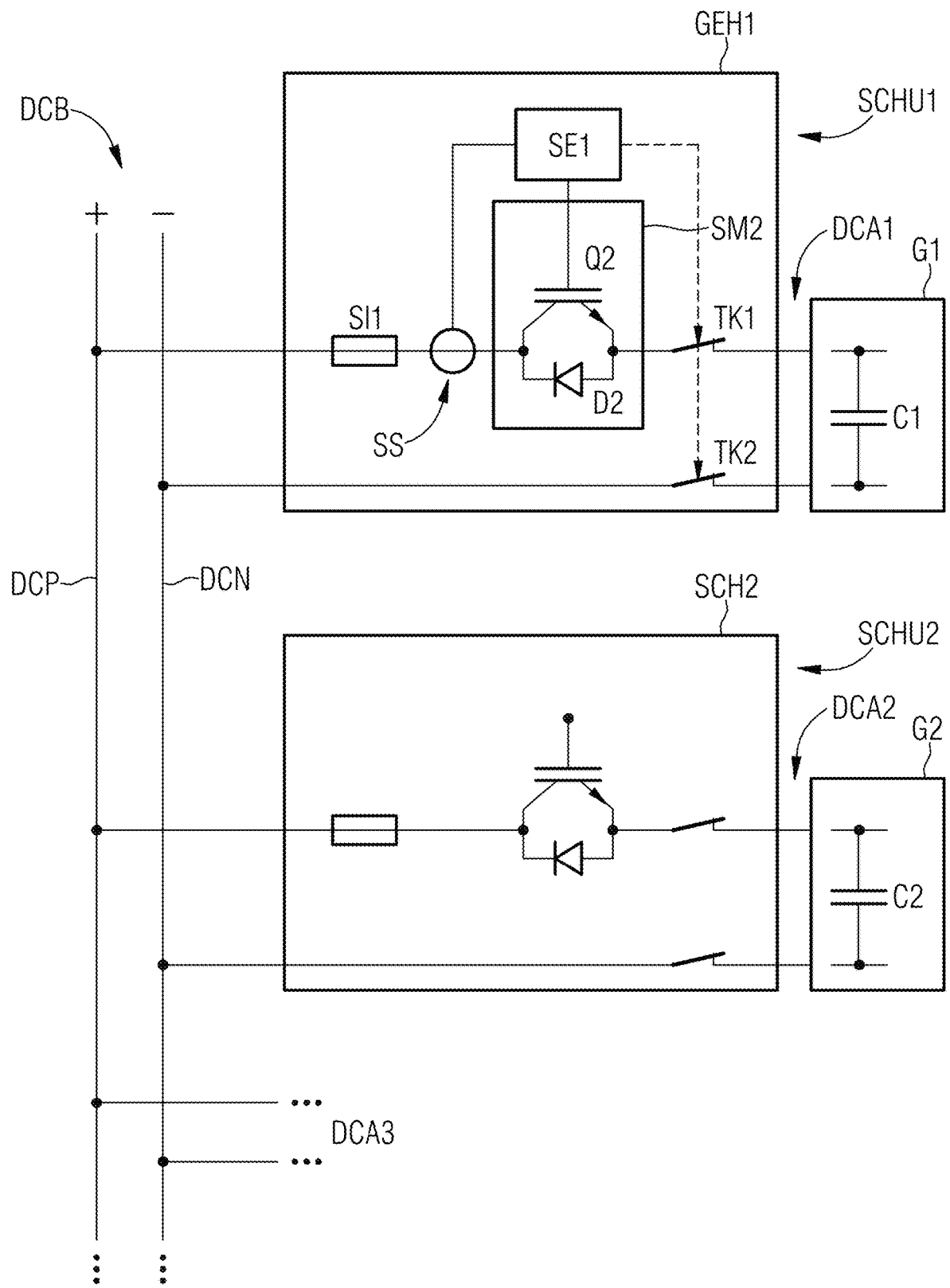
FIG. 2 shows a basic illustration of a DC voltage branch having a circuit breaker device on a DC voltage bus according to an embodiment of the invention.

FIG. 2 shows a basic illustration according to FIG. 1, with the difference that the first switching module SM1 has been replaced with a fuse SI1. In this case, the series circuit comprising the fuse (safety fuse) SI1 and the unidirectional switching module, the second switching module SM2 in the example, is arranged in the positive conductor of the first DC voltage branch DCA1.

A current sensor SS is also arranged in the positive conductor in order to determine the level and direction of the electrical current.

The unidirectional switching module SM2 is connected to a control device SE1 which is in turn connected to the current sensor SS. The control device SE1 can be connected to the isolating contacts TK1, TK2 in order to effect DC-isolation of the first DC voltage branch DCA1.

The fuse SI1, the unidirectional switching module SM2, the current sensor SS and the control device SE1 are arranged in this case in a housing GEH1 which forms the circuit breaker device SCHU1. This may also have the first (and second) isolating contact TK1, TK2. Furthermore, the housing may have a positive conductor input connection, a negative conductor input connection, a positive conductor output connection and a negative conductor output connection.

In the example according to FIG. 2, the input connections are connected to the DC voltage bus DCP, DCN and the output connections are connected to the first DC voltage branch DCA1. The unidirectional switching module SM2 connects the positive conductor input connection to the positive conductor output connection, wherein the fuse SI, the current sensor SS and the first isolating contact are also included.

The negative conductor input connection is connected to the negative conductor output connection via a line, wherein the second isolating contact TK2 may be provided.

Figure 3:
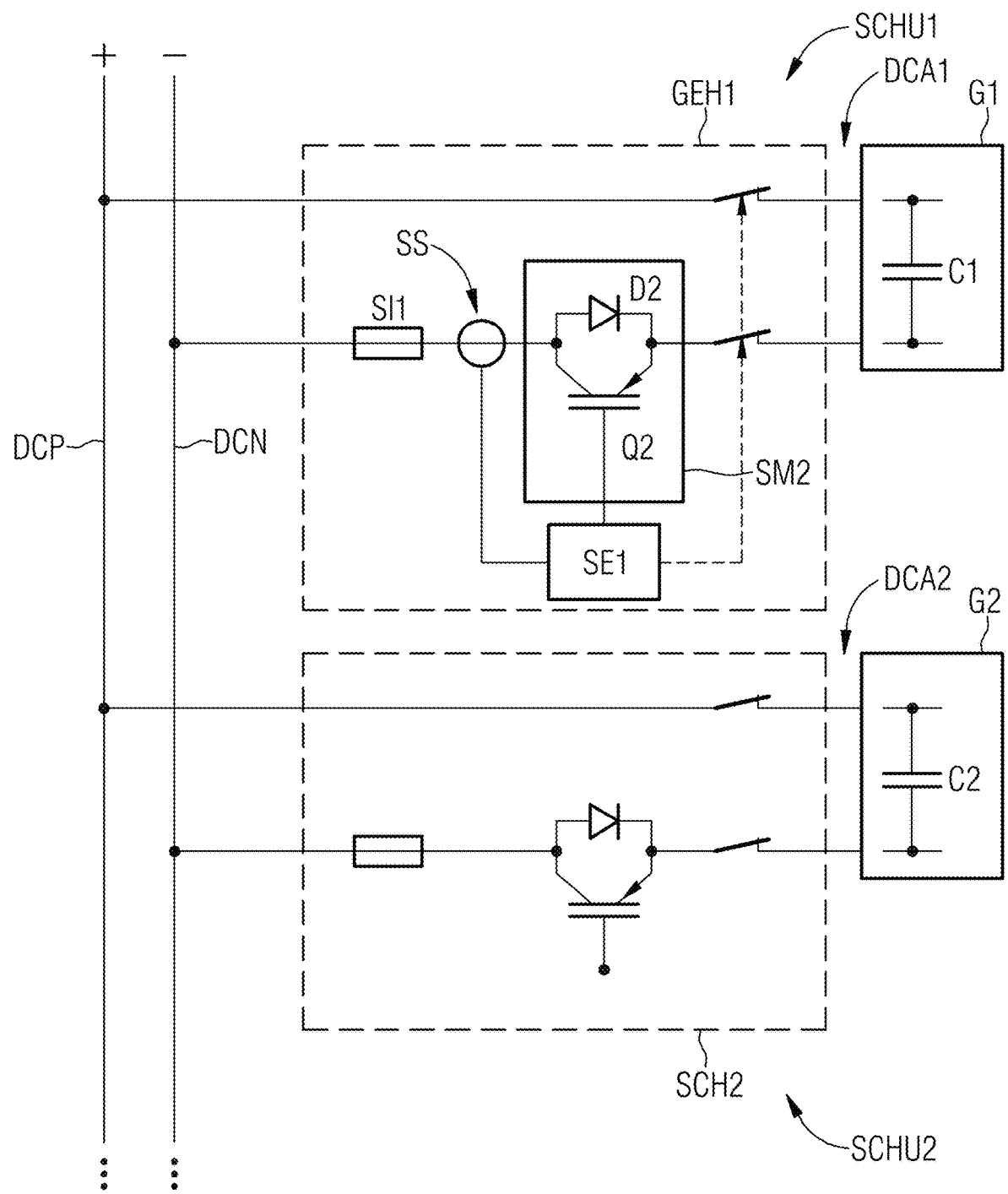
FIG. 3 shows a basic illustration of a DC voltage branch having a circuit breaker device on a DC voltage bus according to an embodiment of the invention.

Alternatively, the series circuit according to an embodiment of the invention may also be accordingly arranged in the negative conductor (opposite current direction) as shown in FIG. 3. The series circuits according to the invention may likewise be included in both conductors.

In the example, in the normal case, the current flows from the positive conductor DCP of the DC voltage bus DCB to the first device G1 via the fuse SI1, the current sensor SS and the unidirectional switching module, the second switching module SM2 in the example, and the first isolating contact TK1.

The current flows from the device to the negative conductor DCN of the DC voltage bus DCB via the second isolating contact and the conductor.

The diode D2 of the unidirectional switching module SM2 in the positive conductor is conductive counter to the normal current direction of the positive conductor. The semiconductor switching element Q2 is conductive in the normal current direction of the positive conductor.

If the voltage at the first device G1 on the first DC voltage branch DCA1 exceeds the voltage on the DC voltage bus DCB, for example in the event of a fault according to FIG. 1, the current flows "in the reverse direction" from the first device G1 to the positive conductor DCP of the DC voltage bus DCB via the diode D2 and the safety fuse SI1.

For such cases, the diode D2 must be designed to be accordingly powerful and should have a low forward voltage.

With an embodiment of the invention, an insulated gate bipolar transistor, a metal oxide semiconductor field effect transistor or a gallium nitride transistor can be advantageously used for the semiconductor switching element Q2.

A second circuit breaker device SCHU2 can be constructed in a similar manner to the first circuit breaker device SCHU1 and can be provided in the second DC voltage branch DCA2, as illustrated in FIG. 2. In a similar manner, further circuit breaker devices may be provided in further DC voltage branches.

At least one embodiment of the present invention combines a fuse together with a unidirectional semiconductor switch in a DC voltage circuit (DC voltage bus with DC voltage branches). As a result, selectivity in the integrated system can be reliably ensured in the event of a fault. The overall system becomes more robust and is more cost-effective than a bidirectional, disconnectable semiconductor switch. At least one embodiment of the invention is of interest for outgoer switches, in particular. The losses are considerably lower than in other semiconductor switches. Control by the control unit also becomes simpler as a result of the reduction in the number of semiconductors to be controlled.

Although the invention has been described and illustrated more specifically in detail via the example embodiment, the invention is not restricted by the disclosed examples and other variations can be derived therefrom by a person skilled in the art without departing from the scope of protection of the invention.

The invention claimed is:

1. A circuit breaker device for coupling a DC voltage branch with a positive conductor and a negative conductor to a DC voltage bus, the circuit breaker device comprising:
    a series circuit including a safety fuse; and
    a unidirectional switching module arranged in a housing, the housing including a positive conductor input connection, a negative conductor input connection, a positive conductor output connection and a negative conductor output connection,
    wherein the positive conductor input connection and the negative conductor input connection are connectable to the DC voltage bus,
    wherein the positive conductor output connection and the negative conductor output connection are connectable to the DC voltage branch,
    wherein either the unidirectional switching module is provided between the positive conductor input connection and the positive conductor output connection or the unidirectional switching module is provided between the negative conductor input connection and the negative conductor output connection, and
    wherein the unidirectional switching module including a parallel circuit includes
        a controllable semiconductor switching element, and
        a diode, wherein
            the controllable semiconductor switching element is conductive only in a first current direction of a current, and
            the diode is in a conducting state in a second current direction of the current, opposite the first current direction.

2. The circuit breaker device of claim 1, wherein the controllable semiconductor switching element is an insulated gate bipolar transistor, a metal oxide semiconductor field effect transistor or a gallium nitride transistor.

3. The circuit breaker device of claim 2, further comprising:
    a current sensor to determine a level of the current and a direction of the current.

4. The circuit breaker device of claim 2, wherein
    upon the unidirectional switching module being arranged in the positive conductor of the DC voltage branch, the controllable semiconductor switching element is conductive counter to a direction of the DC voltage bus, or
    upon the unidirectional switching module being arranged in the negative conductor of the DC voltage branch, the controllable semiconductor switching element is conductive in the direction of the DC voltage bus.

5. The circuit breaker device of claim 2, wherein the safety fuse is arranged on a side of the DC voltage bus.

6. The circuit breaker device of claim 2, further comprising:
    a control device connected to the unidirectional switching module and to a current sensor, the control device configured to control the unidirectional switching module to interrupt current flow in response to a first threshold value of the current in a direction of the conductivity of the controllable semiconductor switching element being exceeded.

7. The circuit breaker device of claim 6,
    wherein the control device is also configured to control the unidirectional switching module to interrupt the current flow in response to a rate of rise of the current in the direction of the conductivity of the semiconductor switching element exceeding a current rise threshold value.

8. The circuit breaker device of claim 1, further comprising:
    a current sensor to determine a level of the current and a direction of the current.

9. The circuit breaker device of claim 8, wherein
    upon the unidirectional switching module being arranged in the positive conductor of the DC voltage branch, the controllable semiconductor switching element is conductive counter to a direction of the DC voltage bus, or
    upon the unidirectional switching module being arranged in the negative conductor of the DC voltage branch, the controllable semiconductor switching element is conductive in the direction of the DC voltage bus.

10. The circuit breaker device of claim 8, wherein the safety fuse is arranged on a side of the DC voltage bus.

11. The circuit breaker device of claim 1, wherein
    upon the unidirectional switching module being arranged in the positive conductor of the DC voltage branch, the controllable semiconductor switching element is conductive counter to a direction of the DC voltage bus, or
    upon the unidirectional switching module being arranged in the negative conductor of the DC voltage branch, the controllable semiconductor switching element is conductive in the direction of the DC voltage bus.

12. The circuit breaker device of claim 1, wherein the safety fuse is arranged on a side of the DC voltage bus.

13. The circuit breaker device of claim 1, further comprising:
    a control device connected to the unidirectional switching module and to a current sensor, the control device configured to control the unidirectional switching module to interrupt current flow in response to a first threshold value of the current in a direction of the conductivity of the controllable semiconductor switching element being exceeded.

14. The circuit breaker device of claim 13, wherein the control device is also configured to control the unidirectional switching module to interrupt the current flow in response to a rate of rise of the current in the direction of the conductivity of the semiconductor switching element exceeding a current rise threshold value.

15. The circuit breaker device of claim 13, wherein the control device is connected to the controllable semiconductor switching element and to the current sensor.

16. The circuit breaker device of claim 1, wherein connections, among the positive conductor input connection, the negative conductor input connection, the positive conductor output connection and the negative conductor output connection, which do not have the unidirectional switching module provided therebetween, are connected to one another by way of an electrical line.

17. The circuit breaker device of claim 1, wherein the safety fuse is in a form of a pyroelectrically tripping fuse.

18. The circuit breaker device of claim 1, wherein the diode includes a low forward voltage.

19. The circuit breaker device of claim 1, wherein the circuit breaker device is usable in an outgoer switch.

20. A DC voltage branch comprising:
the circuit breaker device of claim 1, wherein the circuit breaker device is connected to the DC voltage bus and to devices.

21. An outgoer switch comprising:
a circuit breaker device for coupling a DC voltage branch with a positive conductor and a negative conductor to a DC voltage bus,
the circuit breaker device including
a series circuit including a safety fuse, and
a unidirectional switching module arranged in a housing, the housing including a positive conductor input connection, a negative conductor input connection, a positive conductor output connection and a negative conductor output connection,
wherein the positive conductor input connection and the negative conductor input connection are connectable to the DC voltage bus,
wherein the positive conductor output connection and the negative conductor output connection are connectable to the DC voltage branch,
wherein either the unidirectional switching module is provided between the positive conductor input connection and the positive conductor output connection or the unidirectional switching module is provided between the negative conductor input connection and the negative conductor output connection, and
wherein the unidirectional switching module includes
a parallel circuit including a controllable semiconductor switching element, and
a diode, wherein
the controllable semiconductor switching element is conductive only in a first current direction of a current, and
the diode is in a conducting state in second current direction of the current, opposite the first current direction.

* * * * *